(12) United States Patent
Lu et al.

(10) Patent No.: US 9,892,998 B2
(45) Date of Patent: Feb. 13, 2018

(54) PACKAGE MODULE OF POWER CONVERSION CIRCUIT AND MANUFACTURING METHOD THEREOF

(71) Applicant: DELTA ELECTRONICS, INC., Taoyuan Hsien, Taiwan (CN)

(72) Inventors: Kai Lu, Taiwan (CN); Zhenqing Zhao, Taiwan (CN); Shouyu Hong, Taiwan (CN); Tao Wang, Taiwan (CN); Le Liang, Taiwan (CN)

(73) Assignee: DELTA ELECTRONICS, INC., Taoyuan, Taiwan (CN)

( * ) Notice: Subject to any disclaimer, the term of this patent is extended or adjusted under 35 U.S.C. 154(b) by 0 days.

(21) Appl. No.: 14/918,837

(22) Filed: Oct. 21, 2015

(65) Prior Publication Data
US 2016/0254217 A1  Sep. 1, 2016

(30) Foreign Application Priority Data
Feb. 26, 2015 (CN) .......................... 2015 1 0088393

(51) Int. Cl.
*H01L 23/495* (2006.01)
*H01L 21/56* (2006.01)
(Continued)

(52) U.S. Cl.
CPC ...... *H01L 23/49568* (2013.01); *H01L 21/561* (2013.01); *H01L 23/3107* (2013.01);
(Continued)

(58) Field of Classification Search
CPC ............. H01L 23/528; H01L 23/49555; H01L 23/3107; H01L 23/49541; H01L 21/561; H01L 24/37; H01L 24/367
See application file for complete search history.

(56) References Cited

U.S. PATENT DOCUMENTS 6,914,321 B2 * 7/2005 Shinohara ........... H01L 23/4334
257/502
7,449,726 B2 * 11/2008 Nakanishi ............. H01L 23/562
257/150
(Continued)

OTHER PUBLICATIONS

Ye J, "Switch type regulator e.g. direct current-converter of intergrated circuit module used for portable computer, has power device chips substrte, whose electrodes are connected to lead frame", Jun. 2001, Thomson Reuters, English abstract.*
(Continued)

*Primary Examiner* — Alonzo Chambliss
(74) *Attorney, Agent, or Firm* — Yunling Ren

(57) ABSTRACT

The present disclosure discloses a package module of a power conversion circuit and a manufacturing method thereof. The package module of the power conversion circuit is surface-mountable on a system board. The package module of the power conversion circuit includes: a substrate, a power device die, a molding layer and a plurality of pins. The substrate has a metal layer, an insulating substrate layer and a thermal conductive layer. The insulating substrate layer is disposed between the metal layer and the thermal conductive layer. The power device die is coupled to the metal layer. Devices on the metal layer of the substrate are embedded in the molding layer. The plurality of pins is electrically coupled to the metal layer and embedded in the molding layer, at least a contact surface of each of the pins which is electrically coupled to the system board is exposed, and the contact surface is parallel and/or perpendicular to the thermal conductive layer. The package module with this structure occupies a small area, and facilitates batch production.

15 Claims, 19 Drawing Sheets

(51) Int. Cl.
*H01L 23/00* (2006.01)
*H01L 23/31* (2006.01)

(52) U.S. Cl.
CPC ...... *H01L 23/3121* (2013.01); *H01L 23/4952* (2013.01); *H01L 23/49541* (2013.01); *H01L 23/49555* (2013.01); *H01L 24/81* (2013.01); *H01L 24/97* (2013.01); *H01L 2224/16225* (2013.01); *H01L 2224/32225* (2013.01); *H01L 2224/40225* (2013.01); *H01L 2224/48227* (2013.01); *H01L 2224/73265* (2013.01); *H01L 2224/81192* (2013.01); *H01L 2224/97* (2013.01); *H01L 2924/00015* (2013.01)

(56) References Cited

U.S. PATENT DOCUMENTS

| | | | | |
|---|---|---|---|---|
| 7,800,224 | B2* | 9/2010 | Lee | H01L 23/49531 257/678 |
| 8,450,845 | B2* | 5/2013 | Ikeda | H01L 23/3735 257/706 |
| 8,487,417 | B2* | 7/2013 | Balakrishnan | H01L 23/3107 257/666 |
| 8,653,647 | B2* | 2/2014 | Masuda | H01L 21/565 257/676 |
| 8,710,666 | B2* | 4/2014 | Tsuruoka | H01L 23/24 257/696 |
| 8,796,831 | B2* | 8/2014 | Yang | H01L 23/485 257/676 |
| 9,153,514 | B2* | 10/2015 | Sohn | H01L 23/3107 |
| 2006/0220188 | A1* | 10/2006 | Liu | H01L 23/4334 257/666 |
| 2007/0096293 | A1* | 5/2007 | Wen | H01L 23/3107 257/704 |
| 2007/0138651 | A1 | 6/2007 | Hauenstein | |
| 2009/0042337 | A1 | 2/2009 | Landau et al. | |
| 2009/0243078 | A1 | 10/2009 | Lim et al. | |
| 2014/0299982 | A1 | 10/2014 | Minamio | |

OTHER PUBLICATIONS

1st Office Action dated Nov. 7, 2016 by the TW Office.

* cited by examiner

PACKAGE MODULE OF POWER CONVERSION CIRCUIT AND MANUFACTURING METHOD THEREOF

CROSS REFERENCE

The present application is based upon and claims priority to Chinese Patent Application No. 201510088393.0, filed Feb. 26, 2015, the entire contents of which are incorporated herein by reference.

TECHNICAL FIELD

The present disclosure relates to the field of semiconductor package, and more particularly, to a package module of a power conversion circuit and a manufacturing method thereof.

BACKGROUND

High efficiency, high power density, high reliability and a low cost have always been requirements for a power converter in the field of electrical and electronic devices. High efficiency means energy consumption reduction, energy conservation, emission reduction, environment protection, and a reduced operating cost. High power density means a compact dimension and a light weight, a reduced transportation cost and occupied space as well as saving material resource, so as to reduce a manufacturing cost. High reliability means a longer service life and a lower maintenance cost.

For a power converter, a semiconductor device is one of the major decisive factors to the efficiency. With the development of power converters, modularization of semiconductor devices has become a significant developing trend. Power module packages are also becoming lighter, thinner, shorter and smaller. With the sizes of the power semiconductor device packages becoming smaller, requirement for heat dissipation is growing higher.

FIG. 1 is a cross-sectional view of a conventional quad flat none-lead package (QFN) structure. As shown in FIG. 1, a die 1 is usually surface-mounted on a lead frame 2 via epoxy 5, and then a pad on an upper surface of the die 1 is coupled to a pin of the lead frame 2 through wire bonding, and finally, the die 1, a bonding wire 3 and the lead frame 2 are packaged into an integral body through molding compound 4. Although the packaged structure has advantages of a simple structure, a small package size and high operation efficiency of a system board, etc., there are also obvious problems in heat dissipation. In this structure, the die is surface-mounted on the lead frame, and the lead frame is surface-mounted as an electrode on the system board (not shown in the drawing), therefore, heat generated by the die during operation is dissipated onto the system board through the lead frame right below the die. Most of heat generated by the die will be transferred onto the system board, it will impede effective function of other components on system board (such as a drive unit, a control unit, and the like) Therefore, in practical application, sufficient space is required to be reserved on the system board to prevent the influence to the drive unit and control unit caused by heat, and a specialized heat-dissipation design is required, so as to achieve the purpose of effective heat dissipation.

FIGS. 2A to 2C are cross-sectional views of a dual inline package (DIP) structure. Since a pin of a lead frame 24 is disposed outside of molding compound 25 and occupies certain space, the design of the pins is not beneficial to save system space, and thus needs to be optimized. In addition, since the pin of the lead frame 24 is disposed outside of the molding compound 25, one cavity is required for one module in molding, that is, one mold is required for one kind of size of a package. Thereby, a new mold has to be replaced when the size of the module is changed, thus increasing production costs of power modules due to production of different-sizes of molds. In practical application, in order to avoid the investment in molds, universality of a mold has to be taken into consideration in designing, resulting in limits on the design.

SUMMARY OF THE INVENTION

In view of this, the present disclosure provides a package module of a power conversion circuit and a manufacturing method thereof, in which the package module has a high heat dissipation performance and also meets the requirement for a light and thin package.

Additional aspects and advantages of the embodiments provided by the present disclosure will in part set forth in the description below, and in part will become obvious from the description, or may be learned from practice of the present disclosure.

In an aspect of the present disclosure there discloses a package module of a power conversion circuit, which is surface-mountable on a system board. The package module of the power conversion circuit includes: substrates, power device dies, molding layers and a plurality of pins. The substrate has a metal layer, an insulating substrate layer and a thermal conductive layer. The insulating substrate layer is disposed between the metal layer and the thermal conductive layer. The power device die is coupled to the metal layer. Devices on the metal layer of the substrate are embedded in the molding layer. The plurality of pins is electrically coupled to the metal layer and embedded in the molding layer, at least a contact surface of each of the pins which is electrically coupled to the system board is exposed, and the contact surface is parallel and/or perpendicular to the thermal conductive layer. Wherein the thermal conductive layer of the substrate dissipates heat of devices coupled to the metal layer.

In an embodiment, each of the pins is formed by a lead frame.

In another embodiment, each of the pins is a copper pillar electrically coupled to the metal layer through conductive epoxy.

In still another embodiment, the molding layer at least packages the metal layer of the substrate, and exposes the thermal conductive layer of the substrate.

In still another embodiment, the package module further includes: a metal connector embedded in the molding layer.

In still another embodiment, the metal connector is a bonding wire for electrically coupling the power device dies or electrically coupling the power device die and the metal layer.

In still another embodiment, the metal connector is a copper clip for electrically coupling the power device dies or electrically coupling the power device die and the metal layer.

In still another embodiment, the metal connector is a metal bump on which the power device die is disposed faced downward, for electrical coupling the power device die and the metal layer.

In still another embodiment, the substrate is a metalized ceramic substrate or an insulated metal substrate.

In still another embodiment, each of the pins includes at least one L-shaped metal part composed of a vertical portion and a horizontal portion; and the exposed contact surface of each of the leads is disposed at the horizontal portion.

In another aspect of the present disclosure there discloses a method for manufacturing a package module of a power conversion circuit as mentioned above, including:

step a: manufacturing unpackaged power conversion circuits as a panel;

step b: packaging one side of the power conversion circuits where devices of the power conversion circuits are disposed with a molding layer;

step c: exposing contact surfaces of pins in the power conversion circuits from the molding layer; and step d: cutting the packaged panel of power conversion circuits into a plurality of separated package modules of independent power conversion circuits.

In an embodiment, the step a includes:

step a1: manufacturing a panel of substrates; and step a2: mounting power device dies on the panel of substrates and coupling a panel of pins on the panel of substrates.

In another embodiment, the step d includes:

step d1: pre-cutting the panel of substrates; and step d2: cutting the panel of pins and the molding layer.

In another embodiment, the step a includes:

step a1: arranging separated unpackaged substrates as a panel; and step a2: mounting power device dies on the substrates and coupling a panel of pins on the substrates.

In still another embodiment, the cutting in the step d includes cutting the panel of pins and the molding layer.

In still another embodiment, the panel of pins is formed of a lead frame.

In the package module of the power conversion circuit disclosed by the present disclosure, electricity coupling and heat dissipation may be separated by leading out the pins from a side away from a lower surface of the substrate, which facilitates dissipation of heat during operation of the package module of the power conversion circuit, and since heat may not dissipate to the system board, the space required on the system board for dissipating heat on the system board is saved, and function of other components on the system board may not be affected. In addition, since the pins are within a package body, the utilization efficiency of the package body itself may be effectively improved for saving spaces. In the method for manufacturing a package module of a power conversion circuit disclosed by the present disclosure, a panel of modules is molded, which obviously reduces the requirement on the mold, and even though the size of the package of the power conversion circuit is changed, the mold may not be replaced, and thus the universality of the mold may be improved. Moreover, the production cost for manufacturing the package module of the power conversion circuit may be lowered.

BRIEF DESCRIPTION OF THE DRAWINGS

The above and other features and advantages of the present disclosure will become apparent from detailed description of exemplary embodiments with reference to accompanying drawings.

DETAILED DESCRIPTION OF THE INVENTION

Now, exemplary embodiments will be described more detailed with reference to the accompanying drawings. However, the exemplary embodiments may be implemented in various manners, and shall not be interpreted as being limited to the implementations set forth herein; instead, these embodiments are provided to make the present disclosure more complete and thorough, and fully convey the conception of the exemplary embodiments to the ordinary skills in this art. Throughout the drawings similar reference numbers indicate the same or similar structures, and repeated description thereof will be omitted.

The features and structures described herein may be combined in one or more embodiments in any suitable manner. In the following description, many specific details are provided to facilitate sufficient understanding of the embodiments of the present disclosure. However, the ordinary skills in this art will appreciate that the technical solutions in the present disclosure may be practiced without one or more of the specific details, or by employing other methods, elements, materials and so on. In other conditions, well-known structures, materials or operations are not shown or described in detail so as to avoid obscuring respective aspects of the present disclosure.

Figure 1:
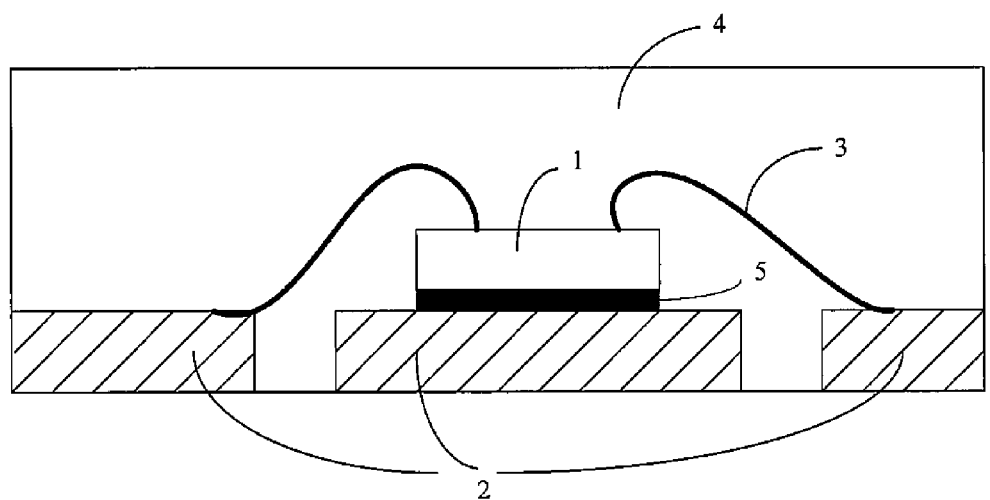
FIG. 1 is a cross-sectional view of a conventional quad flat none-lead package structure.
Figure 2A:
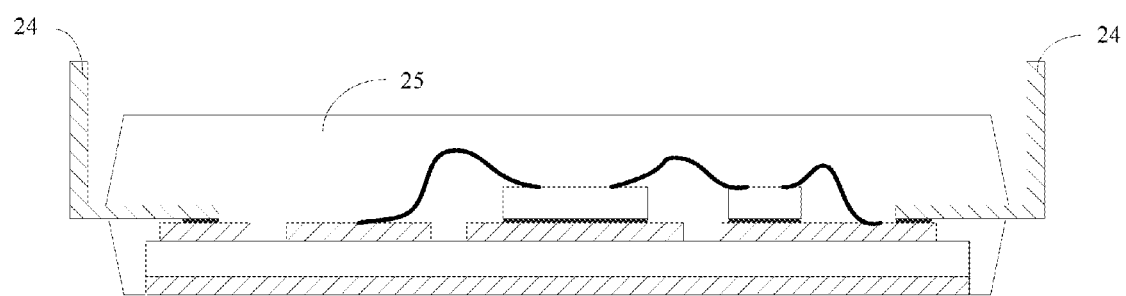
FIGS. 2A to 2C are cross-sectional views of a conventional dual inline package structure.
Figure 2B:
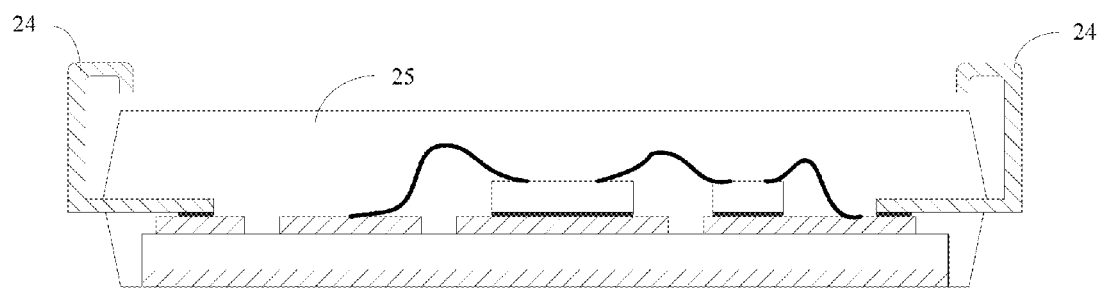
Figure 2C:
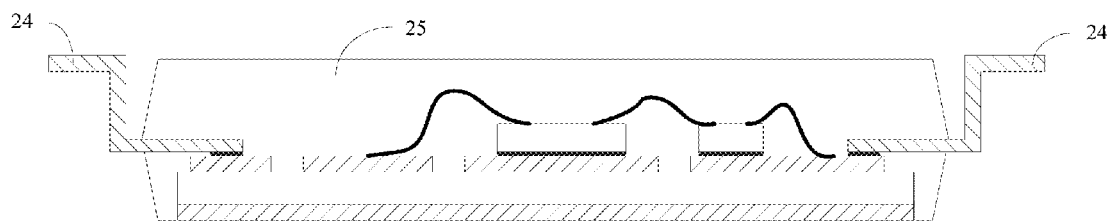
Figure 3:
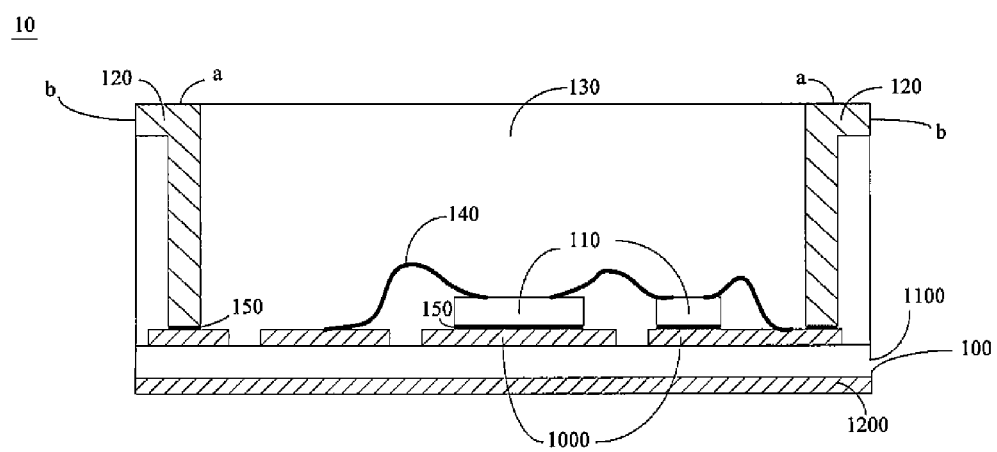
FIG. 3 is a cross-sectional view of a package module of a power conversion circuit according to a first embodiment of the present disclosure.

FIG. 3 is a cross-sectional view of a package module of a power conversion circuit according to a first embodiment of the present disclosure. As shown in FIG. 3, the package module 10 of the power conversion circuit according to the first embodiment of the present disclosure includes: a substrate 100, at least one power device die 110, at least one pin 120 and a molding layer 130.

The substrate 100, serving as a carrying board for mounting at least one power device die 110, has a metal layer, an insulating substrate layer and a thermal conductive layer, wherein the insulating substrate layer is disposed between the metal layer and the thermal conductive layer. For example, at least one power device die 110 may be a Metal Oxide Semiconductor Field Effect Transistor (MOSFET), an Insulated Gate Bipolar Transistor (IGBT) or a diode, and the like. At least one power device die 10 is mounted on a first surface of the substrate 100, and electrically/mechanically/thermally coupled to the substrate 100 via bonding material 150 (such as conductive epoxy, solder, diffusion welding material, and the like). An electrode of each power device die 110 may be electrically/mechanically/thermally coupled to the substrate 100, each pin 120 and the like through wire bonding by a bonding wire 140. Each pin 120 may be bonded on the substrate 100 through conductive epoxy (such as soldering tin, conductive organic slurry, and the like), so as to be electrically coupled to the substrate 100. In addition, passive devices (not shown in the drawing), such as inductors, capacitors and the like, are also mounted on the metal layer of the substrate 100. A thermal conductive layer of the substrate 100 is configured to transfer heat generated by the power conversion circuit during operation.

As shown in FIG. 3, the substrate 100 includes a metal layer 1000, an insulating layer 1100 and a thermal conductive layer 1200. Specifically, a circuit pattern is formed on the metal layer 1000; the insulating layer 1100 is disposed between the metal layer 1000 and the thermal conductive layer 1200; and at least one power device die 110 is formed on the metal layer 1000. A radiator (not shown in the drawing) is externally coupled to the surface of the thermal conductive layer 1200 which is away from the insulating layer 1100. This structure may effectively transfer heat generated by the package module of the power conversion circuit during operation to a side of the substrate 100, and dissipates heat through the externally coupled radiator. In addition, a thermally conductive silicone grease layer may also be disposed between the thermal conductive layer 1200 and the radiator, so as to transfer heat faster and more straightforward.

For example, the substrate 100 may be a direct bonding copper (DBC) substrate, and may also be a thick film substrate, a direct plating copper (DPC) substrate, an insulated metal substrate (IMS), and the like. The present disclosure is not limited thereto. Generally, the thick film substrate is formed by uniformly mixing metal powders (such as Ag, Cu, and the like) and glass materials with binders to obtain muddy slurry, printing the muddy slurry onto a ceramic substrate in the form of circuit patterns by means of a scraper and a mask plate, and hardening the circuit patterns under a sintering temperature of 800~900 degrees. The DPC substrate is formed by firstly cleaning a ceramic substrate as pretreatment, sputtering a composite layer which comprises copper on the ceramic substrate by vacuum coating, then fabricating circuit wires by etching, and finally increasing a thickness of the circuit wires by electroplating or chemical plating to complete the manufacture of a metal layer. The IMS substrate is formed by laminating a layer of organic membrane on a metal plate (Al or Cu, and the like) as an insulating layer, and then electroplating a metalized circuit wires on the insulating film (or laminating a copper foil on the insulating film and then etching it to form circuit wires).

The molding layer 130 is formed by filling molding compound into a mold die (not shown in the drawing) in the manufacturing process, so as to mechanically support and electrically protect the overall structure. The molding layer 130 is formed on the substrate 100, and at least one power device die 110 and at least one pin 120 are packaged within the molding layer 130 to form a package body, including: a top surface and a plurality of side surfaces intersected with the top surface, wherein the top surface is roughly parallel to the substrate 100. In addition, in one embodiment, the metal layer 1000 of the substrate 100 is also packaged in the molding layer 130.

Each pin 120 is electrically coupled to the metal layer 1000 of the substrate 100, and only exposes a contact surface for electrically coupling to an external system board (not shown in the drawing), thereby the package module 10 of the power conversion circuit may be electrically coupled to the system board. In order to form the heat dissipation and the electrical coupling in different sides during the operation of the package module 10 of the power conversion circuit, the contact surface of each pin 120 electrically coupled to the system board (that is, a surface exposed outside the package body) is disposed on the top surface of the molding layer 130. That is, the top surface of each pin 120 is exposed on the top surface of the molding layer 130, and is parallel to the thermal conductive layer 1200 of the substrate 100. For example, as shown in a contact surface a of FIG. 3, thereby the heat dissipation of the package module of the power conversion circuit and the electrical coupling to the system board are respectively disposed on one side of the thermal conductive layer of the substrate and one side of the top surface of the molding layer 130, and thus, the radiator may be mounted on one side of the thermal conductive layer of the substrate to improve the heat dissipation capability of the module. In addition, since heat does not dissipate to the system board, the space required on the system board for dissipating heat is saved, and function of other components on the system board may not be affected.

In addition, in order to simplify the packaging process, and reduce the production cost (the details will be introduced below), each pin 120 is designed to include at least one L-shaped bending part having a horizontal portion and a vertical portion. The angle between the horizontal portion and the vertical portion is not limited to 90 degrees, in consideration of relative positions of the horizontal portion and the vertical portion. Wherein, in addition to the contact surface on the top surface of the horizontal portion, the horizontal portion further includes a contact surface b disposed on one side surface of the molding layer 130, that is, a contact surface which is perpendicular to the thermal conductive layer 1200 of the substrate 100. The vertical portion of each pin 120 is embedded in the molding layer 130, the horizontal portion of each pin 120 is embedded in the molding layer 130, and the top surface of the horizontal portion and one side surface of the horizontal portion of each pin 120 are respectively exposed on the top surface and one of a plurality of side surfaces of the molding layer 130.

In FIG. 3, there are two pins for example. The two pins 120 are respectively disposed at opposite sides of the package module 10 of the power conversion circuit, and their contact surfaces b are respectively disposed on two opposite side surfaces. However, the present disclosure is not limited thereto, for example, it may also include only one pin, and the contact surface is exposed on the top surface and one side surface of the molding layer 130; or it may include more than two pins, and their contact surfaces are respectively exposed on the top surface and a plurality of side surfaces of the molding layer 130.

In addition, each pin 120 may be formed of a lead frame, for example, or each pin 120 is a copper pillar electrically coupled to the metal layer on the substrate through conductive xpoxy.

It can be seen from the above, in the package module 10 of the power conversion circuit of the first embodiment of the present disclosure, electricity coupling and heat dissipation may be separated by leading out the pins from a side away from a lower surface of the substrate, which facilitates dissipation of heat during operation of the package module of the power conversion circuit, and since heat may not dissipate to the system board, the space required on the system board for dissipating heat is saved, and function of other components on the system board may not be affected. In addition, since each pin 120 is entirely within a package body, the utilization efficiency of the package body itself may be effectively improved.

Figure 4:
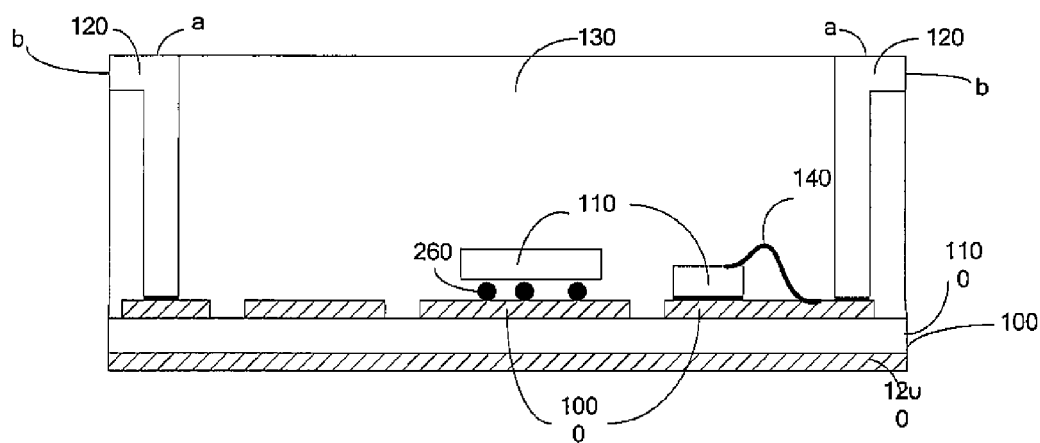
FIG. 4 is a cross-sectional view of a package module of a power conversion circuit according to a second embodiment of the present disclosure.

FIG. 4 is a cross-sectional view of a package module of a power conversion circuit of a second embodiment of the present disclosure. As shown in FIG. 4, a package module 20 of the power conversion circuit of the second embodiment of the present disclosure differs from the package module 10 of the power conversion circuit shown in FIG. 3 in that: the power device die 110 is electrically coupled to the substrate 100 in a different way. The power device die 110 in the package module 20 of the power conversion circuit may also be electrically coupled to the substrate 100 in a form of a flip chip. A metal bump 260 is formed on the pad of the power device die 110, and then the power device die 110 is electrically coupled to the substrate 100 through the metal bump 260. In general, a planar power device die is electrically coupled in a form of a flip chip for example, and the present disclosure is not limited thereto.

Details of the package module 20 of the power conversion circuit of the second embodiment of the present disclosure which are the same with those of the package module 10 of the power conversion circuit of the first embodiment of the present disclosure are not repeated herein.

Figure 5:
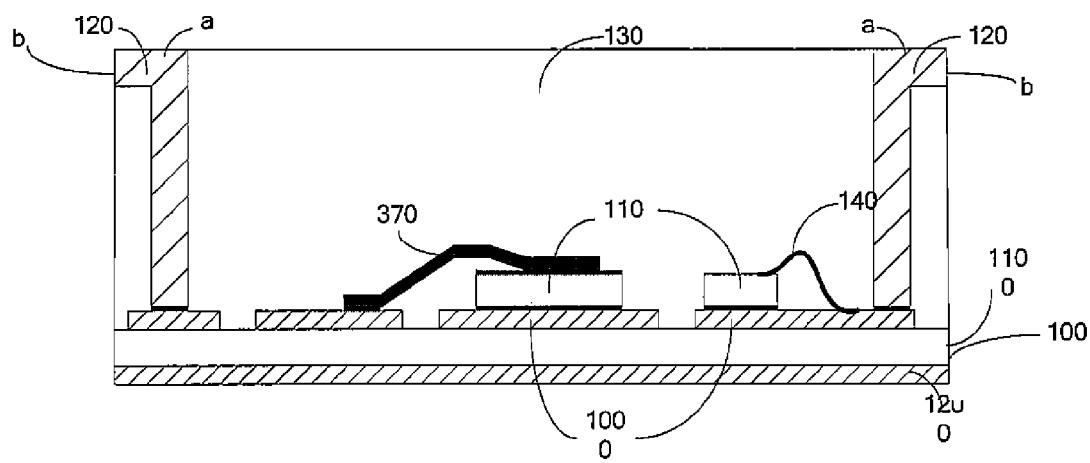
FIG. 5 is a cross-sectional view of a package module of a power conversion circuit according to a third embodiment of the present disclosure.

FIG. 5 is a cross-sectional view of a package module of a power conversion circuit of a third embodiment of the present disclosure. As shown in FIG. 5, also, a package module 30 of the power conversion circuit of the third embodiment of the present disclosure differs from the package module 10 of the power conversion circuit shown in FIG. 3 in that: the power device die 110 is electrically coupled to the substrate 100 in a different way. The power device die 110 in the package module 30 of the power conversion circuit may also be electrically coupled to the substrate 100 by means of a metal clip 370, such as a cooper clip. The metal clip 370 may be firstly electrically coupled to the power device die 110 by welding or sintered material such as silver, and the like, and then the metal clip 370 may be electrically coupled to the substrate 100. In addition, the metal clip 370 may also be a part of the substrate 100, and the present disclosure is not limited thereto.

Details of the package module 30 of the power conversion circuit of the third embodiment of the present disclosure which are the same with those of the package module 10 of the power conversion circuit of the first embodiment of the present disclosure are not repeated herein.

Figure 6:
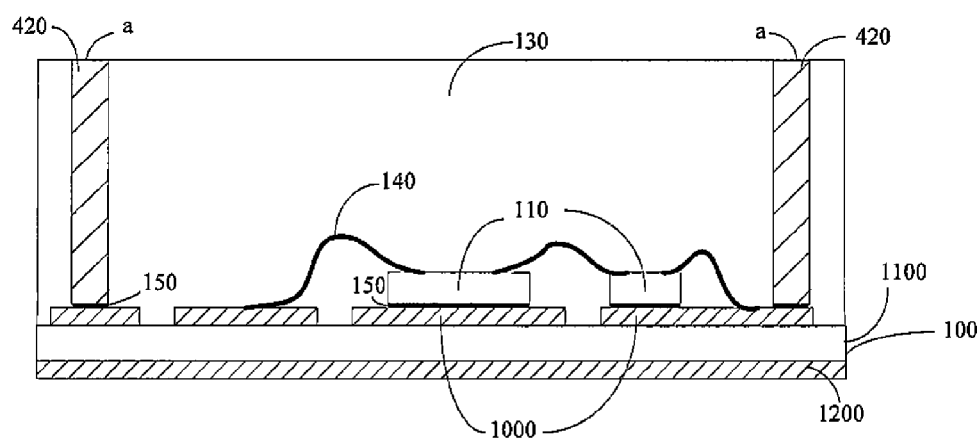
FIG. 6 is a cross-sectional view of a package module of a power conversion circuit according to a fourth embodiment of the present disclosure.

FIG. 6 is a cross-sectional view of a package module of a power conversion circuit of a fourth embodiment of the present disclosure. As shown in FIG. 6, a package module 40 of the power conversion circuit of the fourth embodiment of the present disclosure differs from the package module 10 of the power conversion circuit shown in FIG. 3 in that: the shape of a pin 420 is different from that of the pin 120. The pin 420 is of a columnar shape, and only includes the contact surface a exposed on the top surface of the molding layer 130. In other embodiments, the lead is of an inverted L shape, and only the contact surface of the horizontal portion of the pin on the side surface of the molding layer is exposed, however, the surface portion of the horizontal portion corresponding to the top surface is covered by a thinner molding layer. Details of the package module 40 of the power conversion circuit of the fourth embodiment of the present disclosure which are the same with those of the package module 10 of the power conversion circuit of the first embodiment of the present disclosure are not repeated herein.

Figure 7:
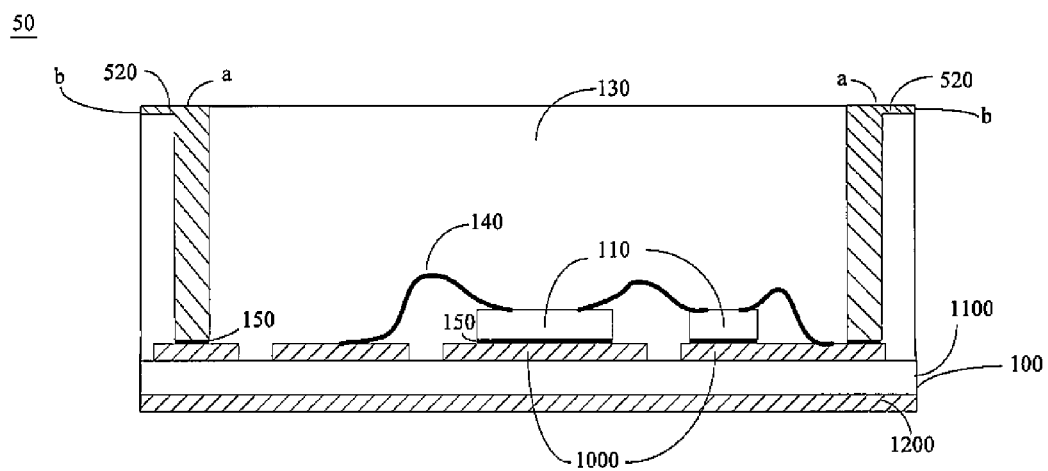
FIG. 7 is a cross-sectional view of a package module of a power conversion circuit according to a fifth embodiment of the present disclosure.

FIG. 7 is a cross-sectional view of a package module of a power conversion circuit of a fifth embodiment of the present disclosure. As shown in FIG. 7, a package module 50 of the power conversion circuit of the fifth embodiment of the present disclosure differs from the package module 10 of the power conversion circuit shown in FIG. 3 only in the design of a pin 520. Compared with the pin 120 in FIG. 3, the thickness of the horizontal portion of the pin 520 is less than the width of the vertical portion of the pin 520. This design may enhance the flexibility of the pin, and reduce the stress generated on the mold during the molding process.

Details of the package module 50 of the power conversion circuit of the fifth embodiment of the present disclosure which are the same with those of the package module 10 of the power conversion circuit of the first embodiment of the present disclosure are not repeated herein.

Figure 8:
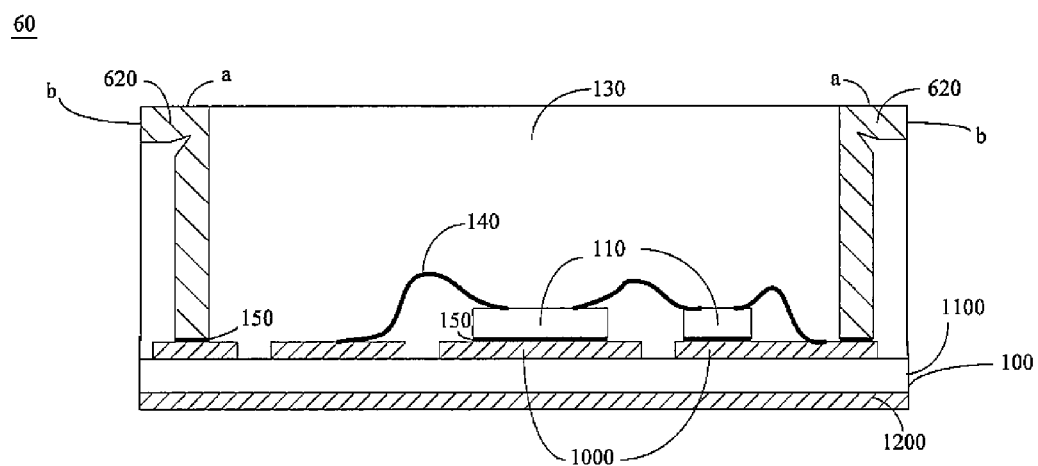
FIG. 8 is a cross-sectional view of a package module of a power conversion circuit according to a sixth embodiment of the present disclosure.

FIG. 8 is a cross-sectional view of a package module of a power conversion circuit of a sixth embodiment of the present disclosure. As shown in FIG. 8, a package module 60 of the power conversion circuit of the sixth embodiment of the present disclosure differs from the package module 10 of the power conversion circuit shown in FIG. 3 only in the design of a pin 620. Compared with the pin 120 in FIG. 3, a groove is disposed at the portion that the horizontal portion is intersected with the vertical portion. On one hand, this design makes the pin to be produced more easily, that is, an angular position of the intersected portion is made more accurate, and thus increasing the machining precision; on the other hand, the flexibility of the lead is increased, and the stress generated in the mold during the molding is reduced.

Details of the package module 60 of the power conversion circuit of the sixth embodiment of the present disclosure which are the same with those of the package module 10 of the power conversion circuit of the first embodiment of the present disclosure are not repeated herein.

Figure 9:
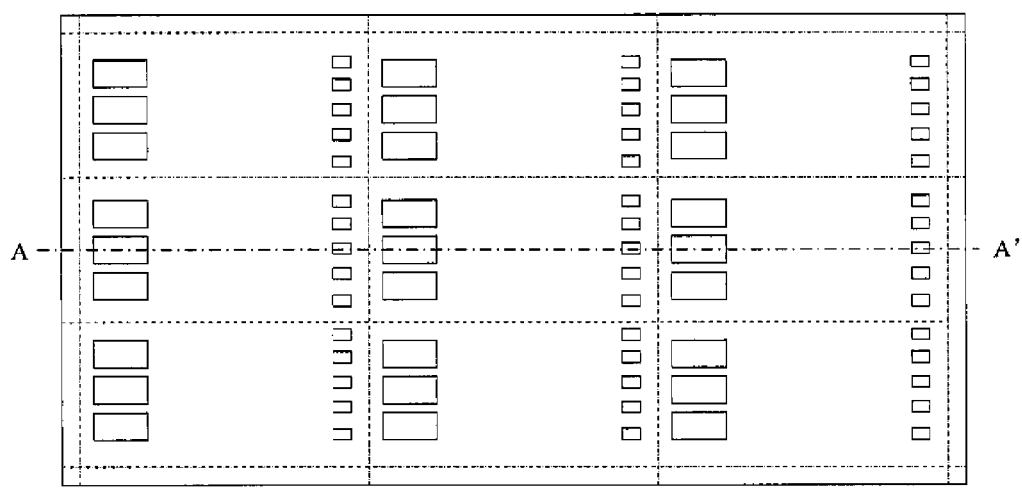
FIG. 9 is a top view of an overall completed packaged package body through a method for manufacturing a package module of a power conversion circuit according to an embodiment of the present disclosure.
Figure 10:
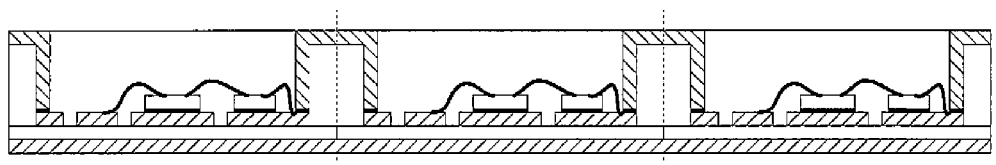
FIG. 10 is a cross-sectional view taken along line AA' of FIG. 9.

FIG. 9 is a top view of an overall packaged package body through a method for manufacturing a package module of a power conversion circuit of an embodiment of the present disclosure. FIG. 10 is a cross-sectional view taken along line AA' of FIG. 9. As shown in FIGS. 9 and 10, requirement on the mold for integrated molding may be significantly lowered, and even though the size of the package of the power conversion circuit is changed, the mold may not be replaced, thus improving the universality of the mold. Moreover, the production cost for manufacturing the package module of the power conversion circuit may be lower.

FIG. 10 still takes the DBC as an example, wherein the internal structure of each package module of a power conversion circuit is substantially the same as the structure in FIG. 3, which is not repeated herein.

It can be seen from FIG. 10, a dotted line is a cutting line between the package modules of the power conversion circuit. That is, the integrated package body may be cut into a plurality of package modules of the power conversion circuits along the dotted line. In order to increase the stability in setting and coupling of the pins, and simplify the manufacturing process, pins of two adjacent package modules of power conversion circuits are preferably of an integrated structure, in which case each contact surface b in FIG. 3 will appear on the side surface of each package module of the power conversion circuit after cutting. However, the present disclosure is not limited thereto.

Similarly, FIG. 10 also takes two pins as an example, and the two pins are respectively disposed on opposite sides of each package module 90 of the power conversion circuit. However, the present disclosure is not limited thereto. For example, a plurality of pins may be disposed on the same side of the package module of the power conversion circuit, and the contact surfaces may be exposed on the top surface and a side surface intersecting with the top surface of the package module of the power conversion circuit; or a plurality of pins may be distributed on different sides of the package module of the power conversion circuit, and their contact surfaces are respectively exposed on the top surface of the package module of the power conversion circuit and the side surface intersecting with the top surface.

The present disclosure also discloses a method for manufacturing the above-mentioned package module, including the following steps:

in step a: unpackaged power conversion circuits are manufactured in a form of a panel;

in step b: one side of the power conversion circuits where devices of the power conversion circuits are disposed is encapsulated with a molding layer;

in step c: contact surfaces of pins in the power conversion circuits are exposed from the molding layer; and in step d: the panel of the encapsulated power conversion circuits are cut into a plurality of separated package modules of independent power conversion circuits.

FIGS. 11A to 11D are flow charts illustrating a method for manufacturing a package module of a power conversion circuit of an embodiment of the present disclosure. The method includes the following steps.

Figure 11A:
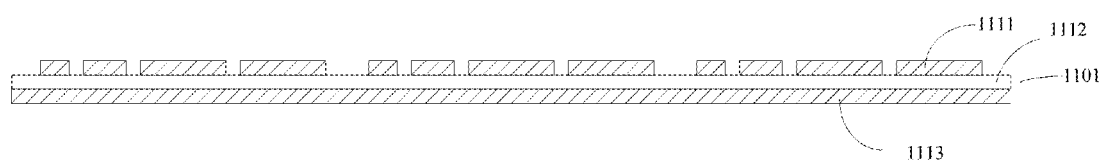
FIGS. 11A to 11D are flow charts illustrating a method for manufacturing a package module of a power conversion circuit according to an embodiment of the present disclosure.

In step a: as shown in FIG. 11A, a panel of substrates 1101 is provided, which is a DBC for example, and the panel of substrates 1101 includes: a metal layer 1111, an insulating layer 1112 and a third copper layer 1113.

Figure 11B:
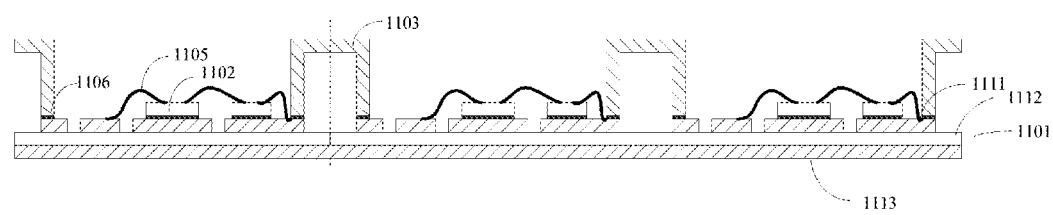

In step b: as shown in FIG. 11B, power device dies 1102 and a panel of pins 1103 are disposed on the panel of substrates 1101, and the power device dies 1102, the panel of pins 1103 and the panel of substrates 1101 are electrically coupled to one another, for example, the electrical/mechanical/thermal coupling with the panel of substrates 1101 is formed through bonding material 1106 (such as conductive epoxy, solder, sintering material, diffusion welding material, and the like); the electrical/mechanical/thermal coupling with the panel of substrates 1101 may be formed by bonding through bonding wires 1105, and the present disclosure is not limited thereto.

Figure 11C:
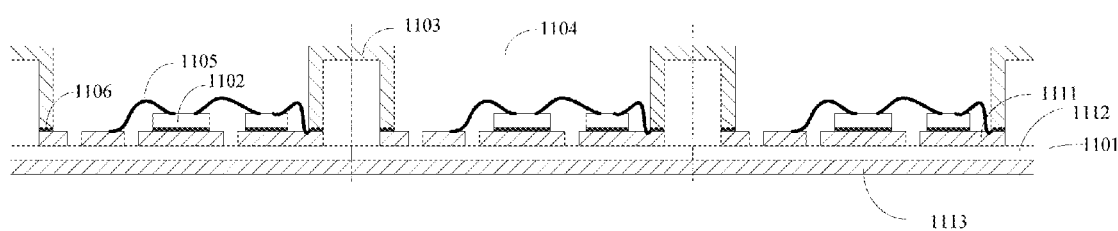

In step c: as shown in FIG. 11C, the panel of substrates 1101, the power device dies 1102 and the panel of pins 1103 are molded as a whole to form an integrated molding layer 1104, the panel of substrates 1101, the power device dies 1102 and the panel of pins 1103 are packaged in the molding layer 1104; and, the top surfaces of the panel of pins 1103 are exposed on the top surface of the integrated molding layer 1104.

Figure 11D:
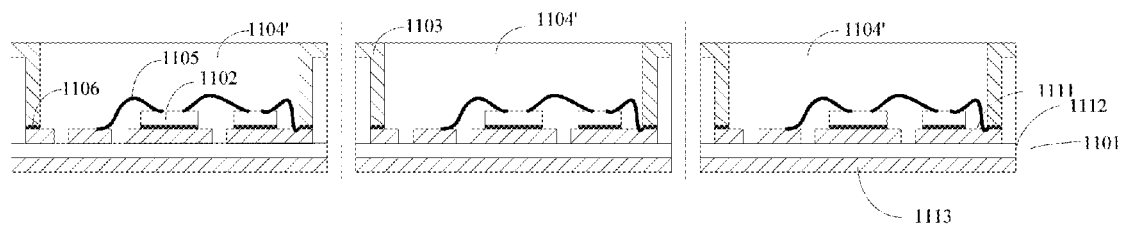

In step d: as shown in FIG. 11D, the integrated molding layer 1104 and the panel of pins 1103 are cut, so that the substrates 1101 and the molding layer 1104' are separated from each other, for example, cut along the dotted line in FIG. 11D, so as to form a plurality of separate package modules of power conversion circuits.

In some embodiments, a pre-cutting may also be performed before cutting the integrated molding layer 1104 and the panel of pins 1103, so as to facilitate the overall cutting.

Figure 12:
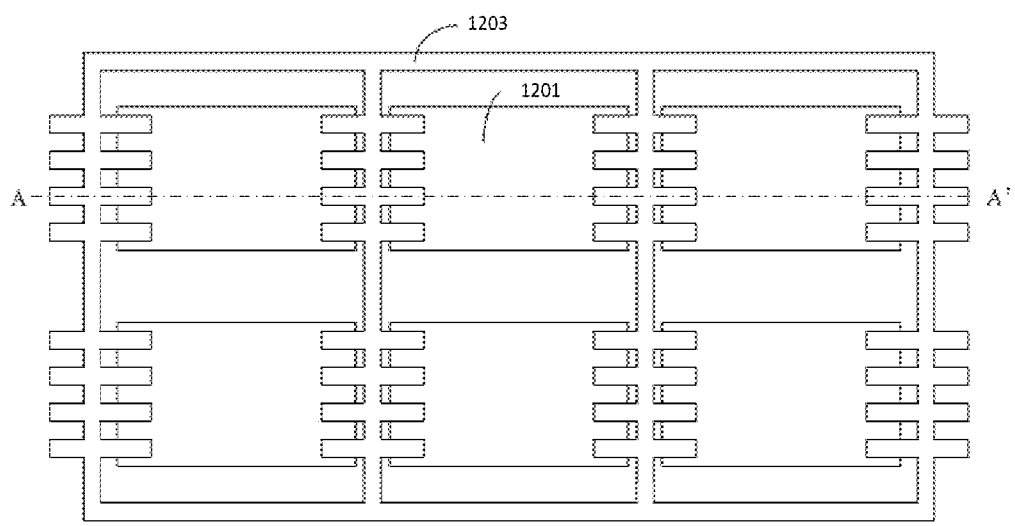
FIG. 12 is a top view of an overall completed packaged package body through a method for manufacturing a package module of a power conversion circuit according to another embodiment of the present disclosure.
Figure 13:
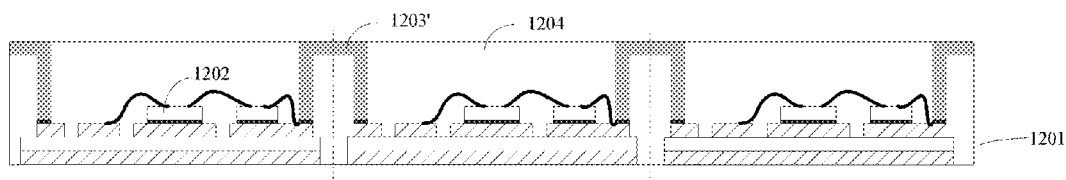
FIG. 13 is a cross-sectional view taken along line AA' of FIG. 12.

FIG. 12 is a top view of an overall packaged package body through a method for manufacturing a package module of a power conversion circuit of another embodiment of the present disclosure. FIG. 13 is a cross-sectional view taken along line AA' of FIG. 12. It is different from the manufacturing method of FIGS. 9 and 10 in that, the substrate in the present embodiment is not a panel of substrates, but a plurality of single substrates 1201, a plurality of separate substrates in a form of a panel are coupled via a panel of pins. The panel of pins may be an integrated lead frame 1203 as shown in FIG. 12. The above power device dies 1202 are surface-mounted and electrically coupled to the substrates and pins 1203' are mounted to the substrates. After that, the substrates 1201, the power device dies 1202 and the pins 1203' are integrated and molded to form the integrated molding layer 1204; and then the substrates 1201 and the molding layer 1204' are separated from each other by cutting the integrated molding layer 1204 and the pins 1203', for example, along the dotted line in FIG. 12, so as to form a plurality of separate package modules of power conversion circuits. By this manufacturing method, the side surface of the substrate of the package module of each power conversion circuit may also be packaged in the package body, so as to protect the side surface of the substrate.

It should be noted that, the above method is only an exemplary explanation, and the execution sequence of the method of the present disclosure is not limited thereto. Whenever possible, the method steps of the invention may be performed in any order.

Figure 14:
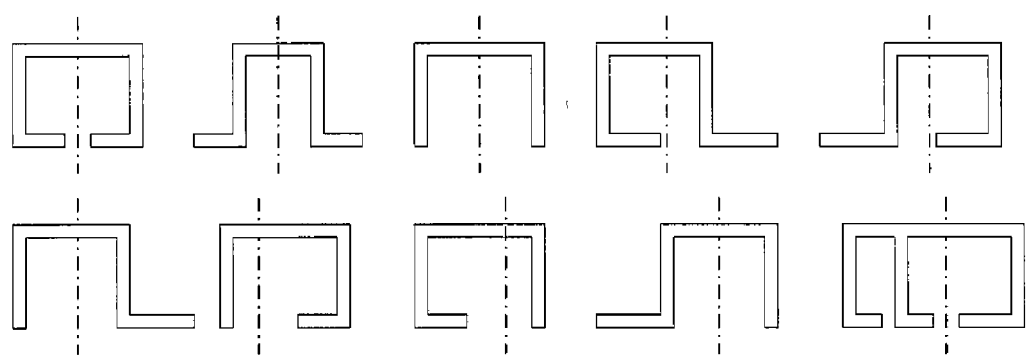
FIG. 14 is a view of a variety of pin structures of a package module of a power conversion circuit according to an embodiment of the present disclosure.

In the structure of the integrated package body as shown in FIG. 10, in addition to the above-disclosed lead structure, FIG. 14 also illustrates other pin structures. It can be seen from FIG. 14, the common points of these pin structures after being cut along the dotted line shown in FIG. 14 are: after being cut, each lead has at least two ends, one end coupled to the substrate, and the other end coupled to the system board as the contact surface. The pin of each of these structures may be easily formed into a panel of pin structure, and facilitate electrical coupling of the pin and the subsequent cutting of pin.

The method for manufacturing a package module of a power conversion circuit disclosed by the present disclosure adopts a panel molding, which obviously reduces the requirement on the mold, and even though the size of the package of the power conversion circuit is changed, the mold may not be replaced, and thus the universality of the mold may be improved. Moreover, the production cost for manufacturing the package module of the power conversion circuit may be lowered.

The exemplary embodiments of the present disclosure have been illustrated and described above. It should be understood that, the present disclosure is not limited to the disclosed embodiments. On the contrary, the present disclosure intends to cover various modifications and equivalent arrangements within the spirit and the scope of the appended claims.

What is claimed is:

1. A package module of a power conversion circuit, the package module of the power conversion circuit being surface-mountable on a system board, wherein, the package module of the power conversion circuit comprises:

a substrate having a metal layer, an insulating substrate layer and a thermal conductive layer, the insulating substrate layer being disposed between the metal layer and the thermal conductive layer;

a power device die coupled to the metal layer;

a molding layer in which devices on the metal layer of the substrate are embedded; and a plurality of pins electrically coupled to the metal layer and embedded in the molding layer, each pin only exposes a contact surface, and the contact surface being parallel and/or perpendicular to the thermal conductive layer;

wherein the thermal conductive layer of the substrate dissipates heat of devices coupled to the metal layer; and the molding layer encapsulates the metal layer of the substrate, and exposes the thermal conductive layer of the substrate, and each of the pins comprises at least one L-shaped metal part composed of a vertical portion and a horizontal portion; the vertical portion of each pin is embedded in the molding layer and each of the pins exposes at least part of top surface of the horizontal portion, and the top surface of the horizontal portion is on the same horizontal plane with the top surface of the molding layer which is opposite to and away from the thermal conductive layer, the side surface of the insulating substrate layer, the sided surface the molding layer, and the side surface of each pin are coplanar.

2. The package module according to claim 1, wherein each of the pins is formed by a lead frame.

3. The package module according to claim 1, wherein each of the pins is a copper pillar electrically coupled to the metal layer through conductive epoxy.

4. The package module according to claim 1, further comprising:

a metal connector embedded in the molding layer.

5. The package module according to claim 4, wherein the metal connector is a bonding wire for electrically coupling the power device dies or electrically coupling the power device die and the metal layer.

6. The package module according to claim 4, wherein the metal connector is a copper clip for electrically coupling the power device dies or electrically coupling the power device die and the metal layer.

7. The package module according to claim 4, wherein the metal connector is a metal bump on which the power device die is disposed faced downward, for electrical coupling the power device die and the metal layer.

8. The package module according to claim 1, wherein the substrate is a metalized ceramic substrate or an insulated metal substrate.

9. A method for manufacturing a package module of a power conversion circuit according to claim 1, comprising:

step a: manufacturing unpackaged power conversion circuits in a form of a panel;

step b: encapsulating one side of the power conversion circuits where devices of the power conversion circuits are disposed with a molding layer and exposing a thermal conductive layer;

step c: only exposing a contact surface of each pin in the power conversion circuits from the molding layer; and step d: cutting the panel of the encapsulated power conversion circuits into a plurality of separated package modules of independent power conversion circuits, wherein, each of the pins comprises at least one L-shaped metal part composed of a vertical portion and a horizontal portion; the vertical portion of each pin is embedded in the molding layer and each of the pins exposes at least part of top surface of the horizontal portion, and the top surface of the horizontal portion is on the on the same horizontal plane with the top surface of the molding layer which is opposite to and away from the thermal conductive layer, the side surface of the insulating substrate layer, the sided surface the molding layer, and the side surface of each pin are coplanar.

10. The method of the package module of the power conversion circuit according to claim 9, wherein the step a comprises:

step a1:manufacturing a panel of substrates; and step a2:mounting power device dies on the panel of substrates and coupling a panel of pins on the panel of substrates.

11. The method according to claim 10, wherein the step d comprises:

step d1:pre-cutting the panel of substrates; and step d2:cutting the panel of pins and the molding layer.

12. The method according to claim 10, wherein the panel of pins is formed of a lead frame.

13. The method according to claim 9, wherein the step a comprises:

step a1:arranging the substrates in the form of the panel; and step a2:mounting power device dies on the substrates and coupling a panel of pins on the substrates.

14. The method according to claim 13, wherein the cutting in the step d comprises cutting the panel of pins and the molding layer.

15. The method according to claim 13, wherein the panel of pins is formed of a lead frame.

* * * * *